US012591027B2

(12) United States Patent
Punzo

(10) Patent No.: US 12,591,027 B2
(45) Date of Patent: Mar. 31, 2026

(54) METHOD FOR PRODUCING PLANAR GRADIENT COILS FOR MRI SYSTEMS, GRADIENT COILS PRODUCED BY THE SAID METHOD AND MRI SYSTEM PROVIDED WITH THE SAID GRADIENT COILS

(71) Applicant: ESAOTE S.p.A., Genoa (IT)

(72) Inventor: Vincenzo Punzo, San Giorgio a Cremano (IT)

(73) Assignee: ESAOTE S.p.A., Genoa (IT)

( * ) Notice: Subject to any disclaimer, the term of this patent is extended or adjusted under 35 U.S.C. 154(b) by 170 days.

(21) Appl. No.: 18/595,893

(22) Filed: Mar. 5, 2024

(65) Prior Publication Data

US 2024/0302463 A1      Sep. 12, 2024

(30) Foreign Application Priority Data

Mar. 8, 2023     (EP) ..................................... 23160644

(51) Int. Cl.
| | |
|---|---|
| *G01R 33/34* | (2006.01) |
| *G01R 33/341* | (2006.01) |
| *G01R 33/385* | (2006.01) |
| *G01R 33/56* | (2006.01) |

(52) U.S. Cl.
CPC ..... *G01R 33/341* (2013.01); *G01R 33/34007* (2013.01); *G01R 33/385* (2013.01); *G01R 33/5608* (2013.01)

(58) Field of Classification Search
CPC ............ G01R 33/341; G01R 33/34007; G01R 33/385; G01R 33/5608; G01R 33/3858
See application file for complete search history.

(56) References Cited

FOREIGN PATENT DOCUMENTS

CN          101266289 B    *    6/2010

OTHER PUBLICATIONS

Machine translation of CN-101266289 (Year: 2008).*
EP Search Report mailed Aug. 4, 2023, by the European Patent Office for corresponding Application No. EP23160644.3. (7 pages).
(Continued)

*Primary Examiner* — G.M. A Hyder
(74) *Attorney, Agent, or Firm* — BUCHANAN INGERSOLL & ROONEY PC

(57)          ABSTRACT
A method for producing planar gradient coils for MRI systems includes defining a planar surface along which one continuous current wire extends along a path for generating a gradient field along a spatial direction; defining the path of the continuous current wire as a spiral path of a single continuous wire filament; describing the spiral path of the continuous current wire by a parametric curve according to a modified version of the Pascal Limaçons curve combined with the Archimede's spiral; applying the Biot-Savart law to evaluate the magnetic field generated by the continuous current wire extending along the spiral path; optimizing the parameters of the parametric curve for shaping the spiral path of the continuous current wire to generate a linear magnetic gradient field along the spatial direction and which gradient magnetic field is linear inside a predetermined volume of space permeated by the linear magnetic gradient field.

15 Claims, 7 Drawing Sheets

(56) References Cited

OTHER PUBLICATIONS

Gondzio, "Interior Point Methods 25 Years Later", European Journal of Operational Research, Feb. 23, 2011, 33 pages.

Xuan et al., "A Smoothly-Connected Crescent Transverse Gradient Coil Design for 50 mT MRI System", Applied Magnetic Resonance, 2021, pp. 649-660, vol. 52, No. 6.

Turner, "A target field approach to optimal coil design", Journal of Applied Physics D: Applied Physics, 1986, pp. L147-151, vol. 19.

Turner, "Gradient Coil Design: A Review of Methods", Magnetic Resonance Imaging, 1993, pp. 903-920, vol. 11.

Zhang et al., "A spiral, bi-planar gradient coil design for open magnetic resonance imaging", Technology and Healthcare, 2018, pp. 119-132, vol. 26, No. 1.

Minhua Zhu et al. "Deformation-Space Method for the Design of Biplanar Transverse Gradient Coils in Open MRI Systems", IEEE Transactions on Magnetics, vol. 44, No. 8, dated Aug. 2008 (8 pages).

* cited by examiner

513

613

613

METHOD FOR PRODUCING PLANAR GRADIENT COILS FOR MRI SYSTEMS, GRADIENT COILS PRODUCED BY THE SAID METHOD AND MRI SYSTEM PROVIDED WITH THE SAID GRADIENT COILS

BACKGROUND

Gradient coils are an integral part of MRI systems. Such coils produce linear magnetic fields that are used to spatially encode an object or body part: linearity allows simple image reconstruction via an inverse 2D or 3D Fourier transform. The standard method for designing gradient coils is based on a Target Field algorithm (TF) that generates, as output, a continuous-current density solution on the defined surface.

Magnetic resonance imaging (MRI) requires accurately linear magnetic field gradients extending over volumes up to 0.08 m³, which can be switched on and off in times of much less than 1 ms. High quality uniform field magnets are normally supplied with a set of shim coils which allow fine tuning of field homogeneity. Ideally, each of these coils produces a given orthogonal harmonic field variation, so that in combination they can generate any desired field homogeneity correction within the limits imposed by the finite supply current available.

A gradient coil, ideally, must have high current efficiency (defined as the ratio of gradient generated to current drawn), short switching time (i.e., low inductance), gradient linearity over a large volume, low power consumption, and minimal interaction with any other equipment resulting in eddy currents. Some of these requirements are obviously in conflict. For instance, to increase the volume over which the gradient is uniform an increase of the stored magnetic energy is connected, and hence an increase of the inductance. Arriving at a practical compromise requires control over as many of these factors as possible, and distributed-arc, target field coils permit more of the variables to be controlled.

The known Target Field Method is a powerful method of designing coils and is discloses in document GRADIENT COIL DESIGN: A REVIEW OF METHODS, Robert Turner, Magnetic Resonance Imaging, Vol. 11, pp. 903-920, 1993 or Turner, R. A target field approach to optimal coil design. J. Phys. D: Appl Phys. 19: L147-151; 1986.

According to the current Target Field Approach, after having calculated a continuous-current density solution on a predetermined surface, the said current distribution is discretized in N wire paths through the application of the Stream Function (SF) algorithm.

FIG. 1 shows a classical result for a Z-axis planar gradient coil of which only half plane is shown, the other half of the coil is identically symmetrical in relation to a symmetry plane parallel to the x axis and to the y axis of the reference coordinate system of FIG. 1.

Analysing the standard algorithm for designing gradient coils according to the state-of-art cited above, two sources of errors appear:

a first one being due to the discretization of the continuous-current density solution, and a second one being due to the connections between the closed wire paths which are necessary for practically generating a current flow through each one of the annular wire paths.

Additional, not controllable, field is thus added to the desired field reducing the coil performances. In other words referred to the shown example of FIG. 1, if the desired field is a gradient field in direction z (a so called Gz-field) of the kind B(z)=G*z an extra field AB will be generated in the practical embodiment of the coils designed by the said method of the state of the art with ΔB=ΔB(x, y, z), this means the additional field will show field contributions in all three space coordinates. In a first order approximation, small concomitant gradient field in x and y direction (so called Gx- and Gy-gradient fields) are generated and errors are introduced in the encoding process.

As already addressed above, the encoding process is the process allowing to relate the receipt signal contributions to different space locations and thus to be able to transform the NMR signals in image data.

SUMMARY OF THE INVENTION

It is an object of the present invention to provide for a method for producing planar gradient coils for MRI systems, which method completely avoids the previously disclosed two sources of errors, namely avoiding discretion of the continuous current distribution and avoiding the provision of connection between closed wire paths and thus at least highly reducing contribution to a gradient field of the said extra field AB with field contributions along other spatial directions.

It is a further object of the present invention to provide for a gradient coil generated by applying the above method.

According to a further object the present invention aims also to provide an MRI system comprising at least one of the gradient coils which is generated by means of the said method.

According to a first embodiment, a method for producing planar gradient coils for MRI systems is provided said method comprising the following steps:

defining at least a planar surface along which at least one continuous current wire extends along a path for generating a gradient field along at least one spatial direction as optionally along one of three spatial directions defined by a reference cartesian coordinate system;

defining the path of the at least one continuous current wire as a spiral path of a single continuous wire filament;

describing the said spiral path of the said at least one continuous current wire by a parametric curve according to a modified version of the Pascal Limançons curve combined with the Archimede's spiral;

applying the Biot-Savard law to evaluate the magnetic field generated by the said continuous current wire extending along the said spiral path;

optimizing the parameters of the said parametric curve for shaping the said spiral path of the continuous current wire in such a way as to generate a linear magnetic gradient field along the said at least one spatial direction and which gradient magnetic field is linear inside a predetermined volume of space permeated by the said linear magnetic gradient field.

According to an embodiment, the optimization algorithm of the parameters of the said parametric curve defining the spiral path along which the said continuous current wire extends is a cost function for minimizing two electrical properties of the gradient coil formed by the said continuous wire extending along the said spiral path which electrical properties consist in the electrical conductance and the electrical resistance of the said coil i.e. of the said continuous current wire extending along the said spiral path.

According to an embodiment, given a cost function f the optimization algorithm is of the kind of a constrained non-linear programming solver according to the following equation:

$$\min f \text{ such that} = \begin{cases} \max\left|\dfrac{B - B_{target}}{B_{target}}\right|\% < \Delta \\ \min \text{ distance between path} > \delta \\ \max \text{ dimensions of the coils} < \Omega \end{cases}$$

in which Δ is a value of accepted linearity in the gradient coil design (in MRI applications, typically equal to 5%), δ is the minimal distance between paths of the windings of the spiral coil that ensure no nodes generation (topological constraint) and Ω is the maximum dimension of the coil in the planar plane where the wire is uncoiled
and in which $B_{Target}$ is the aimed linear magnetic field, i.e. the gradient field to be generated and approximated.

According to a further feature the optimization step comprises using a so called "large-scale interior-point algorithm" as algorithm for carrying out the above minimization as defined by the previous equations.

According to a further embodiment the method provides for the generation of two or more magnetic gradient fields, optionally three magnetic gradient fields, each one being a magnetic gradient field along a different spatial direction of two or more spatial directions, optionally of three spatial directions.

In a variant the three spatial directions are perpendicular one to the other and in a particular embodiment the said three spatial directions are defined by the directions of the axis of a three-dimensional cartesian reference system.

In combination with the above embodiment and variant, the method provides for carrying out the above disclosed steps in anyone of the cited variant embodiments separately for producing planar gradient coils for MRI systems each one of the said planar gradient coils generates a magnetic gradient field in only one of the said three spatial directions and each one of the said gradient coils comprises at least one continuous current wire extending along a spiral path and designed according to the steps of the method disclosed according to one or more of the above embodiments or variants.

According to a further feature each spiral path of the at least one continuous current wire of each one of the said three magnetic gradient coils extends along or is contained in the same planar surface.

It is worth noticing in this relation that the special case of a three-dimensional cartesian coordinate system defining the spatial directions may comprise also cartesian coordinate system which are rotated and/or translated or rotated and translated in relation to the reference coordinate system or also instead of a cartesian coordinate system a difference reference system may be used for describing the volume of space.

The relation between two different kinds of coordinate systems such as a cartesian one or a cylindrical or a spherical one are merely fixed mathematical conversion functions which are defined only by the geometrical laws.

For sake of simplicity and because in the field of application of MRI cartesian systems are mostly used to define the directions of three gradient fields, the current description and the particular examples are described with reference to a cartesian coordinate system describing the volume of space.

According to a further embodiment, in combination with one or more of the above disclosed embodiments and/or variants, the method provides for the definition of a volume of space, so called ROI (Region of Interest);

said volume of space being defined by an ideal closed surface enclosing the said volume of space and defining the peripheral limits of the said volume of space;

defining two planar surfaces at diametrically opposite sides of the said volume of space along each one of the said surfaces the current wire paths of the gradient coils are destined to extend;

the said two planes being optionally parallel one to the other;

defining a tree dimensional cartesian coordinate system the two planes being at a distance along a first axis (y) of the said three-dimensional coordinate system and extending parallel to the plane defined by a second and a third axis (x, z) of the said coordinate system, the parametric curve describing the spiral wire paths for generating a gradient field in the direction of the said third axis (z) is calculated according to the following equation:

$$\vec{l} = (l_x, l_z) = \begin{cases} l_x = c \cdot \left(1 - \left(\dfrac{\varphi}{\theta}\right)^{\alpha}\right)\cos(\varphi) \\ l_z = e \cdot \left(\dfrac{\varphi}{\theta}\right)^f + d \cdot \left((1 + \sin(\varphi)) \cdot \left(1 - \left(\dfrac{\varphi}{\theta}\right)^{\beta}\right)\right)\sin(\varphi) + k \end{cases}$$

where α, β, c, d, e, θ and k are parameters that shape the curve to be defined in accordance with the optimization procedure (see next paragraph);

the parametric curve describing the spiral wire paths for generating a gradient field in the direction of the said first axis (y) is calculated by the following equation:

$$\vec{l} = (l_x, l_z) =$$

$$\begin{cases} l_x = a \cdot \left[1 + \alpha\left(\dfrac{\varphi}{\theta}\right)^2 + \beta\left(\dfrac{\varphi}{\theta}\right)^4 + \gamma\left(\dfrac{\varphi}{\theta}\right)^6 + \delta\left(\dfrac{\varphi}{\theta}\right)^8 + \omega\left(\dfrac{\varphi}{\theta}\right)^{10}\right]\cos(\varphi) \\ l_z = a \cdot \left[1 + \alpha\left(\dfrac{\varphi}{\theta}\right)^2 + \beta\left(\dfrac{\varphi}{\theta}\right)^4 + \gamma\left(\dfrac{\varphi}{\theta}\right)^6 + \delta\left(\dfrac{\varphi}{\theta}\right)^8 + \omega\left(\dfrac{\varphi}{\theta}\right)^{10}\right]\sin(\varphi) \end{cases}$$

Where a, α, β, γ, δ and ω are parameters that shape the curve;

the gradient field in the direction of the said third axis (z-gradient field) being described by the following equation:

$$B_y(x_p, y_p, z_p) = \dfrac{\mu_0}{4\pi} I \int_0^{\theta} \dfrac{dz(x - x_p) - dx(z - z_p)}{R^3} d\varphi$$

Where:

$$R = \sqrt{(x - x_p)^2 + (y - y_p)^2 + (z - z_p)^2}$$

and $$dz = \dfrac{dl_z}{d\varphi} = \left(\dfrac{e}{\theta}\right)^f \varphi^{f-1} +$$

$$d \cdot \cos(\varphi) \cdot \left[1 - \left(\dfrac{\varphi}{\theta}\right)^{\beta} \cdot \sin(\varphi) + d \cdot (1 + \sin(\varphi))\right] \cdot \left(-\left(\dfrac{\beta}{\theta}\right)^{\beta} \cdot \varphi^{\beta-1}\right) \cdot \sin(\varphi) +$$

$$d \cdot (1 + \sin(\varphi)) \cdot \left(1 - \left(\dfrac{\varphi}{\theta}\right)^{\beta}\right) \cdot \cos(\varphi)$$

and;

the gradient field in the said first direction (y-gradient field) being described by the following equation:

$$B_y(x_p, y_p, z_p) = \frac{\mu_0}{4\pi} I \int_0^\theta \frac{dz(x - x_p) - dx(z - z_p)}{R^3} d\varphi \text{ where } R =$$

$$\sqrt{(x - x_p)^2 + (y - y_p)^2 + (z - z_p)^2} \, dz =$$

$$\frac{dl_z}{d\varphi} = a \cdot \left[ 1 + \alpha\left(\frac{\varphi}{\theta}\right)^2 + \beta\left(\frac{\varphi}{\theta}\right)^4 + \gamma\left(\frac{\varphi}{\theta}\right)^6 + \delta\left(\frac{\varphi}{\theta}\right)^8 + \omega\left(\frac{\varphi}{\theta}\right)^{10} \right] \cos(\varphi) +$$

$$a \cdot \left[ \frac{2\alpha\varphi}{\theta^2} + \frac{4\beta\varphi^3}{\theta^4} + \frac{6\gamma\varphi^5}{\theta^6} + \frac{8\delta\varphi^7}{\theta^8} + \frac{10\omega\varphi^9}{\theta^{10}} \right] \sin(\varphi) \text{ and } dx =$$

$$\frac{dl_x}{d\varphi} = -a \cdot \left[ 1 + \alpha\left(\frac{\varphi}{\theta}\right)^2 + \beta\left(\frac{\varphi}{\theta}\right)^4 + \gamma\left(\frac{\varphi}{\theta}\right)^6 + \delta\left(\frac{\varphi}{\theta}\right)^8 + \omega\left(\frac{\varphi}{\theta}\right)^{10} \right] \sin(\varphi) +$$

$$a \cdot \left[ \frac{2\alpha\varphi}{\theta^2} + \frac{4\beta\varphi^3}{\theta^4} + \frac{6\gamma\varphi^5}{\theta^6} + \frac{8\delta\varphi^7}{\theta^8} + \frac{10\omega\varphi^9}{\theta^{10}} \right] \cos(\varphi)$$

According to a further feature, the cost function is the following:

$$\text{cost function } f = L_{COIL} = \oint_l \vec{dl} = \int_0^\theta \sqrt{dz^2 + dx^2} \, d\varphi$$

According to a further feature in relation to the above disclosed embodiment, the design of the gradient coil generating a gradient field in the said second axis direction (x) is equal to the design of the gradient coil generating the gradient field in the said third axis direction (z) but rotated by 90° around the said y-axis.

According to the second object of the present invention an embodiment of the gradient coil generated by one or more of the above disclosed embodiments or variants of the method comprises a current wire made of a continuous filament which is distributed along at least one planar surface and extending along a spiral path;

Said spiral path being designed according to the steps of the method disclosed according to one or more of the above disclosed embodiments or variants.

According to an embodiment the gradient coil according to the present invention comprises at least two conductive wire, bands or tracks extending along a respective spiral path and each of the said spiral paths extends along a respective one of two planar surfaces being parallel to each other and at a certain distance one form the other along a first axis (y), while the said two plane surfaces extend along a second and a third axis perpendicular to the said first axis. According to a further embodiment a gradient coil is configured for generating a gradient field in the direction of the said second or third axis and comprises for each of the two planar surfaces, two non-coinciding spiral paths along each one of them a conductive wire, band or track extends the said two spiral paths being symmetrical to one another in relation to an axis oriented perpendicular respectively to the second axis for the coils generating the gradient field in the direction of the second axis and to the third axis for the coils generating the gradient field in the direction of the third axis or to a plane extending perpendicular to the said second or third directions.

According to a further feature a gradient coil for generating the gradient magnetic field in the direction of the said first axis comprises on at least one on or both planar surfaces a wire extending along a spiral having a circular path and which windings are centred with the said first axis.

The present invention relates to an MRI system comprising a magnet structure comprising:

a static magnetic field generator in a spatial volume, the said static magnetic field being oriented parallel to a first axis (y), said static magnetic field generator forming a gantry, delimiting said spatial volume;

gradient coils for generating gradient magnetic fields inside said spatial volume respectively a magnetic gradient field in the direction of the said first axis (y), a magnetic gradient field in the direction of a second axis (x) perpendicular to the said first axis (y) and a magnetic gradient field in the direction parallel to a third axis (z) perpendicular to the said first axis (y) and to the said second axis (x);

RF-coils for generating RF excitation signals of the nuclear spins due to the physical capacity of atomic nuclei of absorbing and re-emitting electromagnetic radiation;

at least one RF-antenna for collecting the RF signals emitted by the transition of the nuclear magnetic spins from the excited condition in which the nuclei has absorbed electromagnetic energy into the relaxed condition in which the nuclei has re-emitted the absorbed electromagnetic energy;

a magnet driving and control section which is responsible for driving resistive or a superconductive magnet when the static magnetic field generator comprises resistive or a superconductive magnets or which is responsible for executing temperature controls of the magnetized material when the static magnetic field generator comprises permanent magnets;

a gradient coil driving unit which provides driving of the gradient coils in a synchronized way with the generation and transmission of the RF-excitation signals;

a RF generation unit for generating the RF excitation signals to be transmitted by the RF excitation coils to the target region of a body under examination and which region is coincident or contained inside a spatial volume, i.e. an imaging volume permeated by the static magnetic field and the gradient magnetic fields;

a processing unit of the RF signals acquired by the RF antenna for transforming said RF signals in image data;

a display control unit for processing the image data in order to display these data according to different display modes on a display monitor and in which each of the said gradient coils comprises at least a continuous current wire which extends along a spiral path, said spiral path extending on at least one of a plane which is perpendicular to the direction of the said static magnetic field or along two planes which are parallel to each other and perpendicular to the direction of the static magnetic field and which are placed at diametrically opposite sides of the volume of space permeated by the said static magnetic field;

each of the said spiral paths of the said continuous current wires being shaped according to one or more of the embodiments or variants of the method disclosed above.

In the above description and in the following description as well as in the claims the term continuous current wire is equivalent to the term continuous conducting wire or electric conductive wire. Furthermore, the term wire may be used for indicating a traditional wire according to the usual meaning of wire such as a mono filament or a multifilament wire od a tape or a track or an element having a thickness and a width which are small in relation to the longitudinal dimensions.

DETAILED DESCRIPTION

The following description of the embodiments of the present invention is made by focusing to a specific configuration which is the most suitable for being applied in the field of MRI to MRI apparatuses, particularly to apparatuses having a magnetic structure comprising two opposite poles which are supported at a distance one from the other by the said magnetic structure and between which poles a static magnetic field is generated having magnetic field lines oriented in a direction perpendicular to the said poles. Typically, in the field of MRI this direction is defined along the Y-axis of a cartesian coordinate system and the static magnetic field is named Bo.

Figure 11:
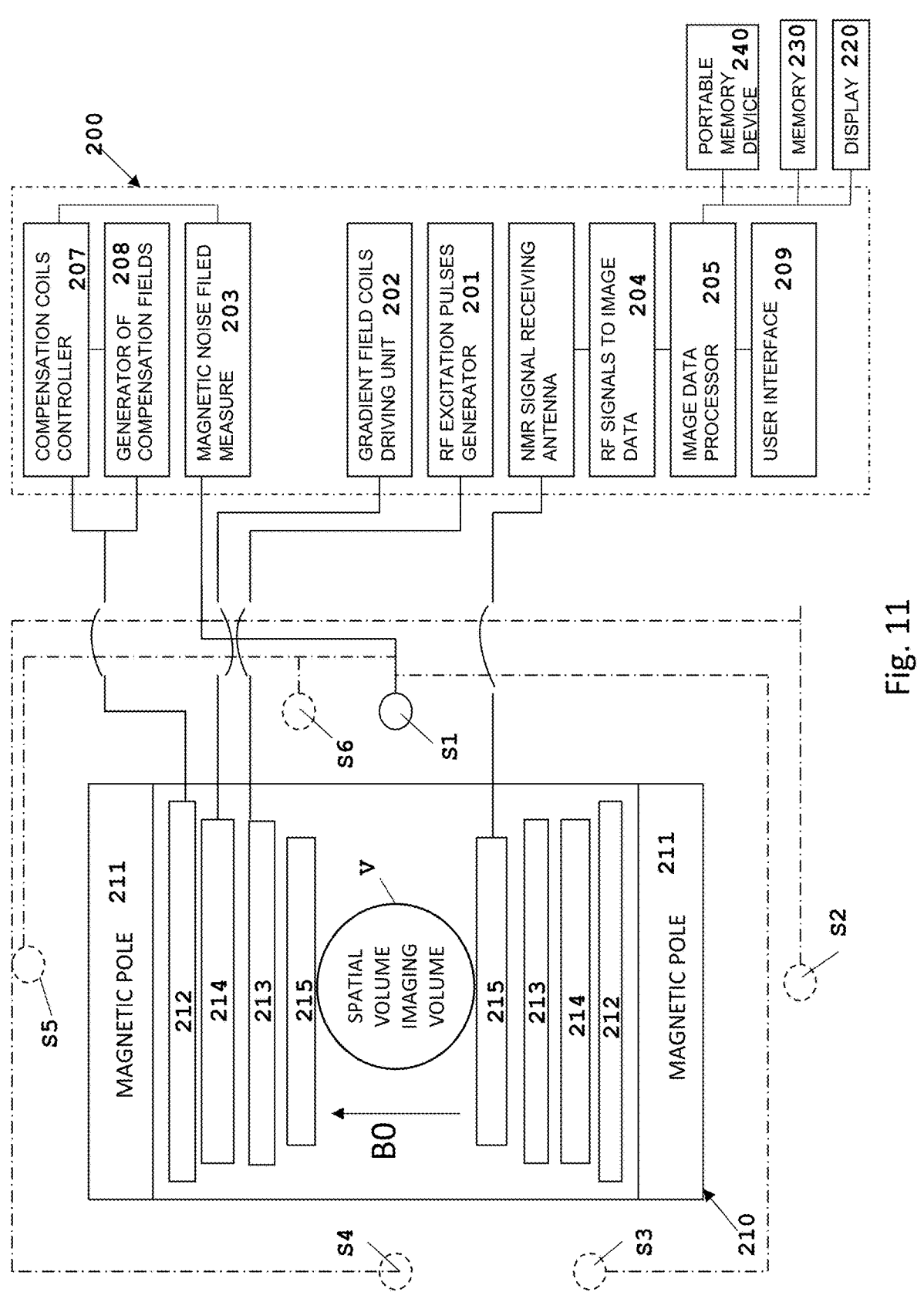
FIG. 11 is a simplified block diagram showing an embodiment of an MRI apparatus in which gradient coils obtained by the method according to the present invention are mounted.

FIG. 11 describes an exemplary embodiment of an MRI apparatus according to the state of the art and comprising a static magnetic field B0 generator globally indicated by 210.

This static magnetic field generator 210 can comprise superconductive coils, resistive coils permanent magnets, or combinations thereof.

According to the exemplary embodiment of FIG. 11, the static magnetic field generator 210 comprises two opposite magnetic poles 211 which delimits on diametrically opposing sides a gantry, i.e. a cavity, for accommodating the body under examination, or a part thereof.

A dashed line and the numeral 200 denote the control and processing electronics of a Magnetic Resonance imaging apparatus, whereas the blocks included therein are additional functional units, or have functions accomplished by appropriately programmed or controlled units of the Magnetic Resonance imaging apparatus.

These control and processing electronics drive operating units associated to the static magnetic field generator 210 and in case this generator includes superconductive and/or resistive coils, also the driving current of the said coils.

The static magnetic field generator 210 such as a magnet, generates a static magnetic field B0 permeating the volume of the said cavity which is delimited, at least partially, by the poles 211, and specifically a part of the said volume of the said cavity defined as special volume or imaging volume represented by the sphere V in FIG. 11.

It has to be noticed that the imaging volume is a part of the total volume of the cavity in which the patient is placed and within which the static magnetic field B0 shows magnetic field inhomogeneities lower then some part per million and within which the gradient magnetic fields vary respectively in the X, y, and z-direction according to a strict linear function along the said direction Furthermore, the representation of the limits of the said imaging volume V as a spherical surface is only an example, any other shape being possible for the peripheral surface representing the limits of the said imaging volume V. Other typical examples are elliptical surfaces or semi spherical or semi elliptical surfaces.

The exemplary MRI apparatus according to FIG. 11 further comprises at least one exciting pulse transmission coil 213 for transmitting to the body under examination one or more sequences of RF pulses for NMR excitation which coil is controlled by a RF excitation pulse generator 201.

The magnet structure comprises magnetic gradient fields generating coils 214 for generating during scanning, a magnetic field with a predetermined variation along each of three spatial directions (x, y, z) having the function of univocally encoding the nuclear spins and thus allowing to relate the NMR signal contributions of the RF signals received by the RF antenna 215 to a position in space for reconstructing an image. The magnetic gradient fields generating coils 214 are driven by a gradient field coil driving unit 202.

The RF NMR signals are processed by a processing unit converting the RF data into image data indicated by 204 and to an image generation unit 205. The reconstructed images can be displayed on a display 220 or stored in memories 230 which can be alternatively or in combination internal memories of the MRI apparatus or memories residing in an external storage server or in cloud servers. Optionally the images can be stored in portable memory devices 240 such as CD rom, DVD rom CD RAM, DVD RAM, memory sticks, portable hard disks, or similar devices.

A user interface 209 providing alternatively or in combination different user input devices is provided. The user interface may be alternatively or in combination a graphical user interface, a vocal user interface, a keyboard, a mouse or a similar device, a input port of command strings which has been generated by a remote device.

Optionally the MRI system of comprises at least one probe S1 and/or further probes S2, S3, S4, S5, S6 which are connected to the input of a processing unit 203 for determining characteristic parameters of the magnetic noise field outside the cavity V of the Magnetic Resonance imaging apparatus and this characteristic data is fed to a compensation coils controller 207. The compensation coil controller

207 controls a compensation field generator 208 which provides the driving power signals for feeding the compensation coils 212.

According to an embodiment the control electronics of the MRI apparatus can be entirely or at least in part in the in the form of software units, consisting of programs for controlling programmable hardware of the Magnetic Resonance imaging apparatus, such as a PC or a central processing and control unit. Optionally the control electronics of the MRI apparatus can be entirely or in part dedicated hardware in which the functional logic is incorporated in the hardware.

Independent gradient coils are provided for generating respectively a gradient field showing a linear variation of the magnetic field along one of three spatial directions, one of these directions being parallel to the direction of the static magnetic field and the two other directions being perpendicular to each other and to the direction of the static magnetic field.

according to a notation which is typical for MRI systems, these spatial directions are defined according to a reference cartesian coordinate system in which the Y axis is parallel to the direction of the static magnetic field and the x and z axis spans the planar surface essentially parallel to the magnetic poles 211.

Furthermore, each gradient coil for respectively one of the said three directions is provided on two planar surfaces each one of the said planar surfaces being provided on the corresponding magnetic pole 211.

In particular, each gradient coil is formed by one or more continuous electrically conductive wires, bands or tracks which extend along a spiral path along each of the two planar surface parallel to the x and z axis of the said reference system and essentially to the associated one of the two magnetic poles 211.

Figure 2:
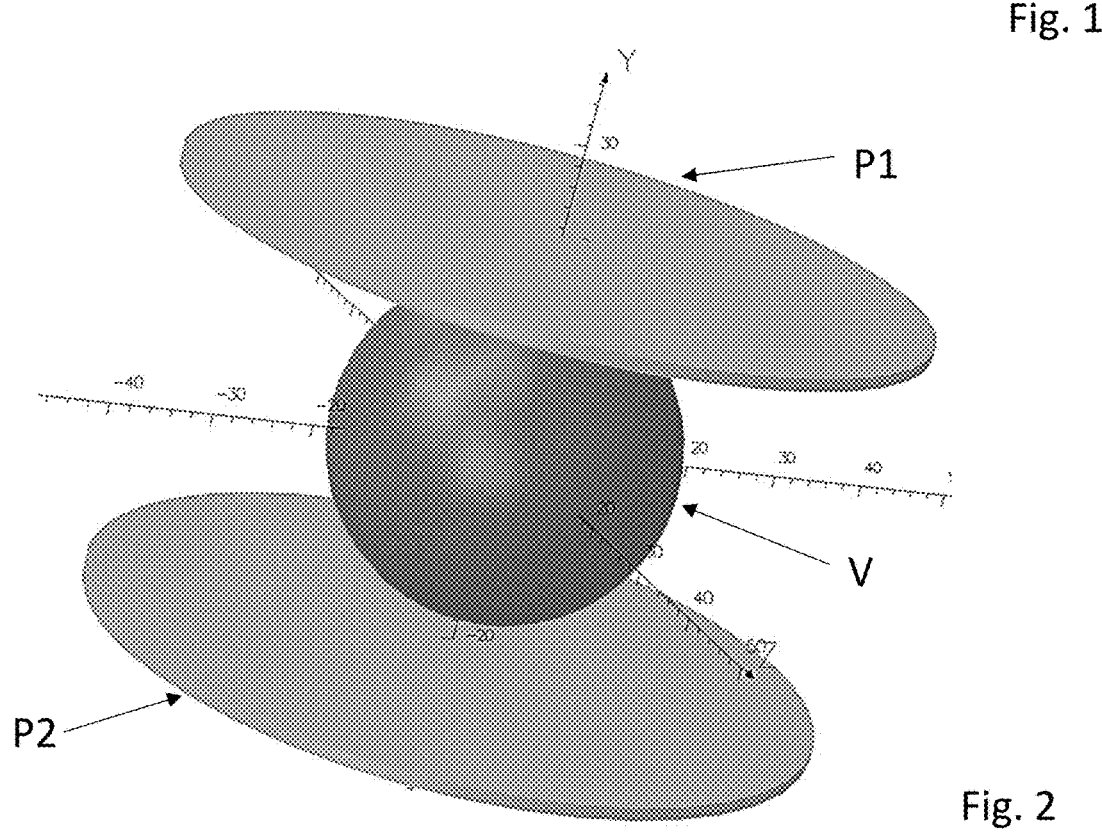
FIG. 2 to 4 shows schematically different views of the geometry of a gradient coil according to an embodiment of the present invention comprising a bi-planar structure along each one of said surfaces at least current wire in spiral form is provided and said planar surfaces being placed at diametrically opposite sides of a volume of space.
Figures 3, 4:
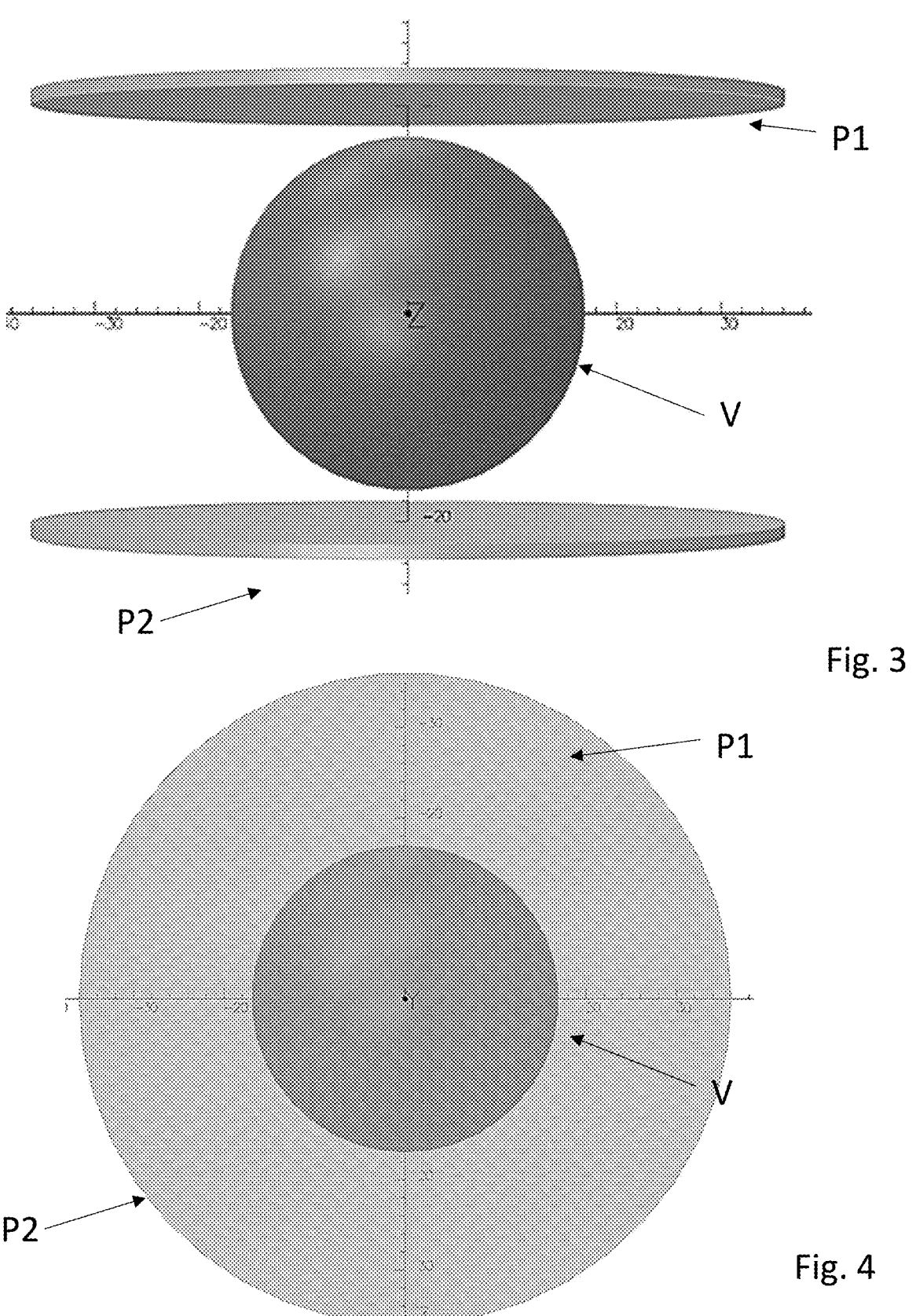

FIG. 2 to 4 show a simplified representation of the imaging Volume V and of the two planar surfaces along each one of which one or more continuous coils for each of the said gradient coils extend along a specifically shaped spiral path, as it will appear in the following description.

In an embodiment, each coil comprises a substrate made of non-magnetic and non-electrically conductive material on the said substrate or within a certain thickness of the said substrate the said one or more conductive wires or bands or tracks extend along a spiral path. The said substrate being a layer or a plate having a certain thickness and the conductive wires, band or track being electrically isolated at the surfaces of the said layer or plate, so that each of the three gradient coils can be positioned overlaid one on top to the other and on the magnetic pole avoiding electric contacts of the wires, bans or tracks of one gradient coil with the wires, bands or tracks of the other gradient coils and/or with the poles.

FIGS. 2 to 4 furthermore show the cartesian reference system and the axis forming it.

Figure 5:
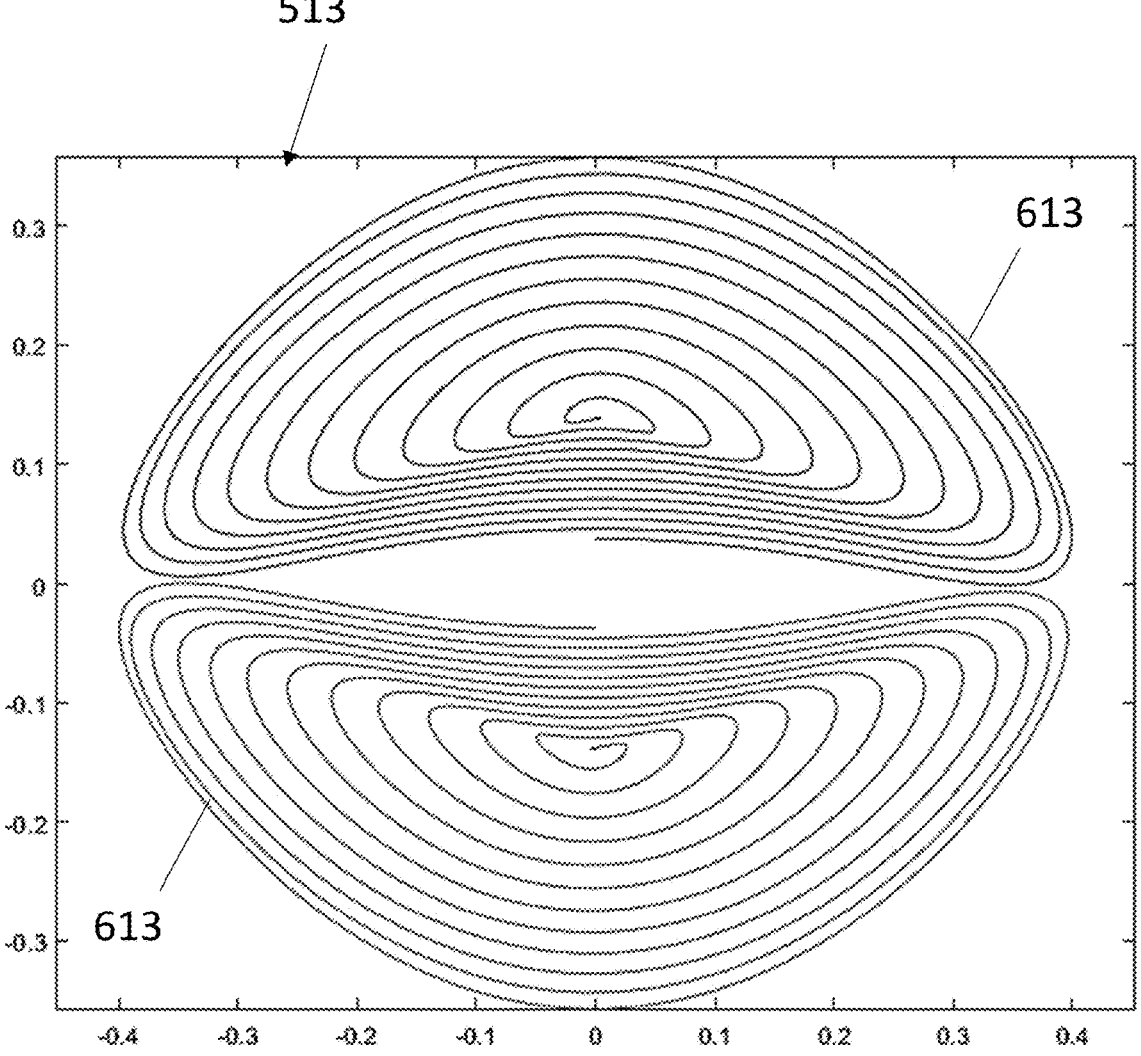
FIG. 5 shows a schematic view of an embodiment of a bi-planar Z gradient coil according to the bi-planar geometry of the previous FIGS. 2 to 4 and obtained by the method according to the present invention.

FIG. 5 show an example of a gradient coil 213-*z* configured for generating a so-called z-gradient field, which is a magnetic field which strength varies linearly in the direction of the z axis namely, according to the function B(z)=const.*z.

As it appears on a support layer or plate 513 two continuous conductive wires, bands or tracks 613 extends along a spiral path forming two conductive elements which are symmetric one to the other along a symmetry plane parallel to the plane defined by the x and y-axis of the reference coordinate system, i.e. perpendicular to the direction according to the z-axis.

In a specific embodiment the said symmetry plane passes through the origin of the reference coordinate system.

According to the above FIG. 5 represents only the part of the z-gradient coil associated to one magnetic pole 211, the complete coil being formed by two of the said elements according to FIG. 5 each one coupled to one of the two magnetic poles 211.

Due to symmetry the x-gradient coil has the same construction as the z-gradient coil with the difference that the spiral paths along which the continuous conductive wires, bans or tracks extend are rotated of 90° relatively to the configuration of FIG. 5 around the y-axis.

In both the z- and x-gradient coils the form of the spiral path is not circular but almost or approximately semi-circular.

Figure 8:
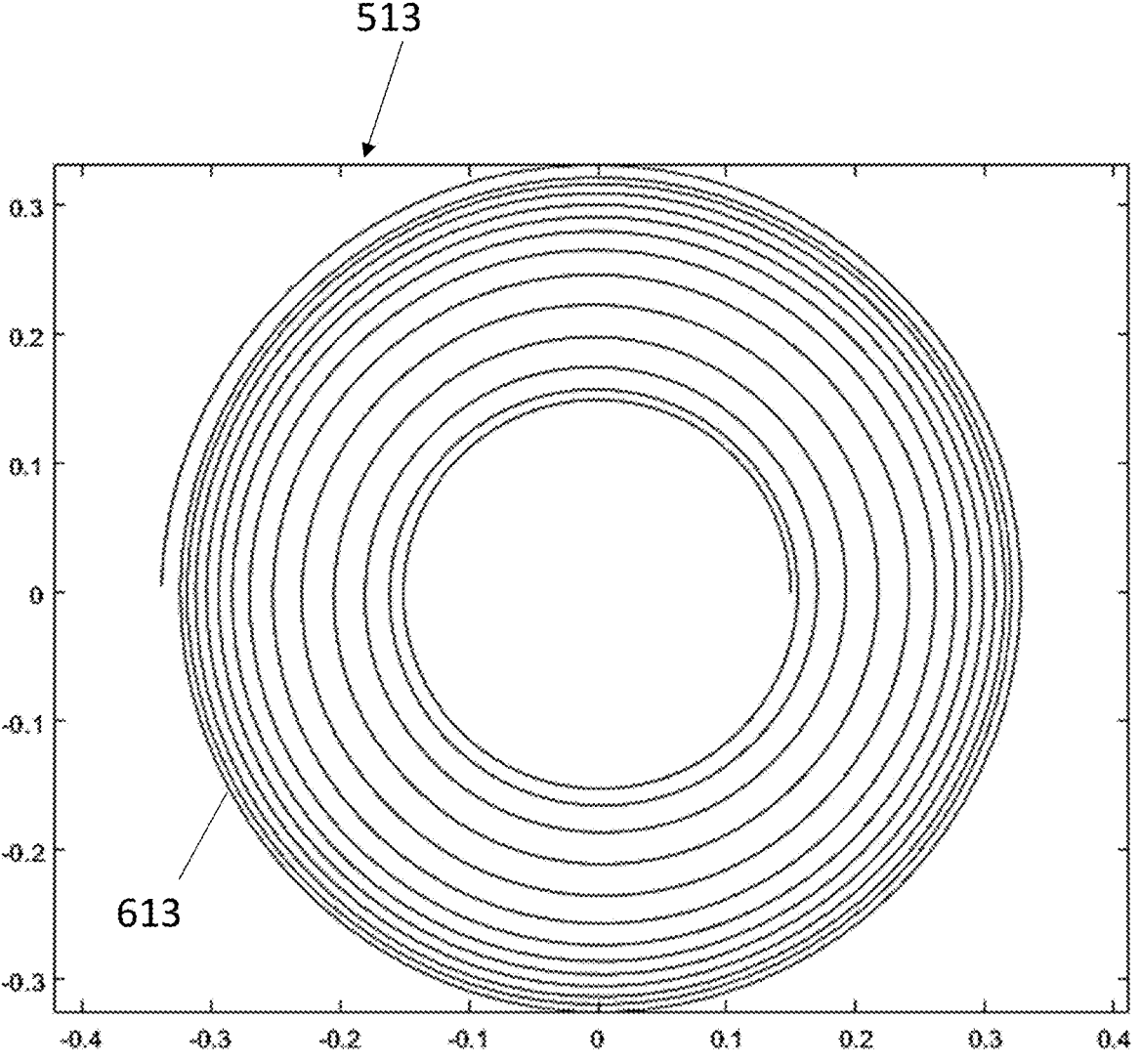
FIG. 8 is an schematic example of an optimized Y gradient coil obtained with the method according to the present invention.

FIG. 8 shows the spiral path of the continuous conductive wire, band or track 613 on the planar layer 513 associated to one of the poles, the complete y-gradient coils being formed by one of the said elements coupled to each one of the two poles 211.

Similarly to the z- and x-gradient coils a substrate in the form of a layer or plate of nonconductive material encloses or supports a continuous conductive wire or band or track 613 extending along a spiral path which windings are almost circular.

The specific configuration of the spiral paths of the continuous conductive wires or bands or tracks is obtained by applying the steps of the method disclosed in the following. The following description of the method and the mathematical formalism of the equations for calculating and optimizing the spiral paths of the continuous conductive wires, bands or tracks are related to the specific geometrical conditions represented in FIGS. 2 to 4. This conditions allows to facilitate the comprehension of the method and the mathematical equations but is not limiting the principle of the method which can be adapted to other geometrical conditions or configurations of the static field and of the magnetic field generators.

According to the above, the direction of the static main magnetic field B0 inside the cavity MRI apparatus is along the Y-axis. The current wire, i.e. the continuous conductive wires, bands or track that will generate the gradient fields along the three cartesian axes is distributed on the two planar surfaces P1 and P2 (see FIG. 2 and FIG. 3).

The imaging Volume of ROI V (region of interest is chosen to be spherical.

Figure 1:
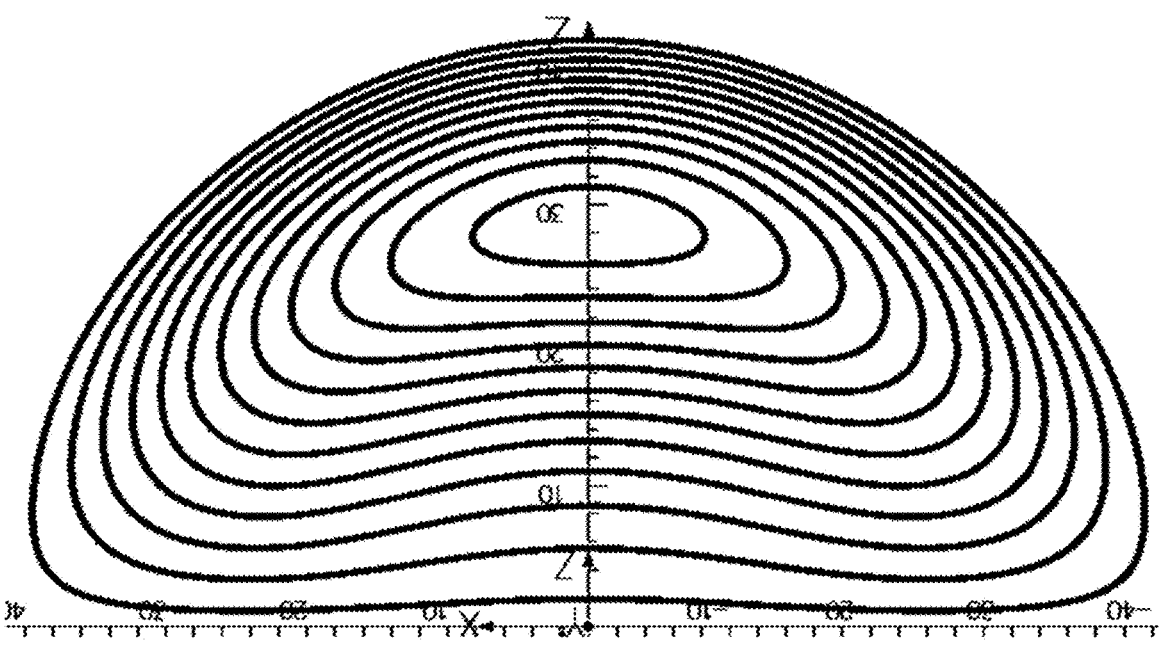
FIG. 1 schematically shows only one half of a standard planar Z-gradient coil obtained by applying a method of the state of the art.

Considering the case of the Z gradient coil, i.e. a coil that generate a $B_y=G{\cdot}z$ field, with G=gradient amplitude, inside the spherical ROI, starting from the standard expected shape of a Z gradient coil shown in the FIG. 1, the basic idea is to consider for the wire, band or track in the coil plane respectively a parametric curve presentation as follow:

$$\vec{l} = (l_x, l_z) = \begin{cases} l_x = c \cdot \left(1 - \left(\frac{\varphi}{\theta}\right)^{\alpha}\right)\cos(\varphi) \\ l_z = e \cdot \left(\frac{\varphi}{\theta}\right)^{f} + d \cdot \left((1 + \sin(\varphi)) \cdot \left(1 - \left(\frac{\varphi}{\theta}\right)^{\beta}\right)\right)\sin(\varphi) + k \end{cases}$$

Where $\alpha$, $\beta$, c, d, e, $\theta$ and k are parameters that shape the curve of the spiral path and which will be further determined in accordance with the optimization procedure which is carried out in a later step. The parametric curve choice is a modified version of the Pascal limançons curve mixed with the Archimede's spiral.

The well-known Biot-Savard law is applied to evaluate the magnetic field generated in a point $\vec{r}$ by a current I flowing in $d\vec{l}$ curve placed in the $\vec{r'}$ position:

$$B(\vec{r}) = \frac{\mu_0}{4\pi} \oint_l \frac{I d\vec{l} \times (\vec{r} - \vec{r'})}{|\vec{r} - \vec{r'}|}$$

Now, considering the parametric curve choice and only the Y component of the field B, the following equation is obtained $$B_y(x_p, y_p, z_p) = \frac{\mu_0}{4\pi} I \int_0^\theta \frac{dz(x - x_p) - dx(z - z_p)}{R^3} d\varphi$$

Where:

$$R = \sqrt{(x - x_p)^2 + (y - y_p)^2 + (z - z_p)^2}$$

$$dz = \frac{dl_z}{d\varphi} = \left(\frac{e}{\theta}\right)^f \varphi^{f-1} + d \cdot \cos(\varphi) \cdot \left[1 - \left(\frac{\varphi}{\theta}\right)^\beta \cdot \sin(\varphi) + d \cdot (1 + \sin(\varphi))\right] \cdot$$

$$\left(-\left(\frac{\beta}{\theta}\right)^\beta \cdot \varphi^{\beta-1}\right) \cdot \sin(\varphi) + d \cdot (1 + \sin(\varphi)) \cdot \left(1 - \left(\frac{\varphi}{\theta}\right)^\beta\right) \cdot \cos(\varphi)$$

This equation can be further processed using an optimization algorithm which allows to determine the parameters defining the shape of the spiral path as already defined above.

According to an embodiment an optimization may be carried out according to the following steps:

A specific constrained optimization algorithm is used in order to define the curve parameters $\alpha$, $\beta$, c, d, e, $\theta$ and k such that a configuration of the spiral path is determined generating a linear magnetic gradient field Btarget inside the above predefined ROI V with a minimization of a defined cost-function and respecting geometrical and topological constraints.

According to the present example, the following cost function is chosen in which the total length of the spiral coil is defined as follow:

$$\text{cost function } f = L_{COIL} = \oint_l d\vec{l} = \int_0^\theta \sqrt{dz^2 + dx^2} \, d\varphi$$

This choice of cost function ensures a minimization of two important electrical properties of a gradient coil: the total electrical inductance of the coil and the total electrical resistance. This implies a minimization of the total stored energy and total dissipated power of the coil.

As an optimization algorithm the above indicated constrained nonlinear programming solver is applied for finding the minimum of a problem specified by:

$$\min f \text{ such that} = \begin{cases} \max \left| \frac{B - B_{target}}{B_{target}} \right| \% < \Delta \\ \min \text{ distance between path} > \delta \\ \max \text{ dimensions of the coils} < \Omega \end{cases}$$

Where $\Delta$ is the standard value of accepted linearity in the gradient coil design and equal to 5% according to current practice in the MRI field, $\delta$ is the minimal distance between the path of each winding of the spiral coil.

According to an embodiment, typical values for the said minimal distance are about some millimeters such as about to 5 mm. This is a topological constraint which ensures that no nodes are generated between windings. D is the maximum dimension of the coil in the planar plane where the wire is uncoiled.

According to an embodiment a specific algorithm used is the so called "large-scale interior-point algorithm". This algorithm handles large, sparse problems, as well as small dense problems. The above algorithm is disclosed with more details in the publication Interior Point Methods for Linear, Quadratic and Nonlinear Programming, Turin 2008, Jacek Gondzi Lectures available at http://calvino.polito.it/~pieracini/Didattica/Gondzio/Gondzio_lectures_1_10.pdf. As a practical info the said algorithm is also implemented in Matlab with the fmincom routine.

In the case of gradient-Y, i.e. a coil that generate a B_y=G·y field in the ROI V, with G=gradient amplitude, a different parametrized curve has to be chosen:

$$\vec{l} = (l_x, l_z) = \begin{cases} l_x = a \cdot \left[1 + \alpha\left(\frac{\varphi}{\theta}\right)^2 + \beta\left(\frac{\varphi}{\theta}\right)^4 + \gamma\left(\frac{\varphi}{\theta}\right)^6 + \delta\left(\frac{\varphi}{\theta}\right)^8 + \omega\left(\frac{\varphi}{\theta}\right)^{10}\right]\cos(\varphi) \\ l_z = a \cdot \left[1 + \alpha\left(\frac{\varphi}{\theta}\right)^2 + \beta\left(\frac{\varphi}{\theta}\right)^4 + \gamma\left(\frac{\varphi}{\theta}\right)^6 + \delta\left(\frac{\varphi}{\theta}\right)^8 + \omega\left(\frac{\varphi}{\theta}\right)^{10}\right]\sin(\varphi) \end{cases}$$

Where a, $\alpha$, $\beta$, $\gamma$, $\delta$ and $\omega$ are parameters which shape the curve of the spiral path and which parameters are to be defined, also in this case, in accordance with an optimization procedure, particularly an optimization procedure as disclosed above for the optimization of the design of the gradient −z coil.

In this case, the parametric curve choice is a modified version of the Archimede's spiral. An example is show in FIG. 8.

as in the case of gradient Z:

$$B_y(x_p, y_p, z_p) = \frac{\mu_0}{4\pi} I \int_0^\theta \frac{dz(x - x_p) - dx(z - z_p)}{R^3} d\varphi \text{ Where}: R =$$

$$\sqrt{(x - x_p)^2 + (y - y_p)^2 + (z - z_p)^2} \, dz =$$

$$\frac{dl_z}{d\varphi} = a \cdot \left[1 + \alpha\left(\frac{\varphi}{\theta}\right)^2 + \beta\left(\frac{\varphi}{\theta}\right)^4 + \gamma\left(\frac{\varphi}{\theta}\right)^6 + \delta\left(\frac{\varphi}{\theta}\right)^8 + \omega\left(\frac{\varphi}{\theta}\right)^{10}\right]\cos(\varphi) +$$

$$a \cdot \left[\frac{2\alpha\varphi}{\theta^2} + \frac{4\beta\varphi^3}{\theta^4} + \frac{6\gamma\varphi^5}{\theta^6} + \frac{8\delta\varphi^7}{\theta^8} + \frac{10\omega\varphi^9}{\theta^{10}}\right]\sin(\varphi) \quad dx =$$

$$\frac{dl_x}{d\varphi} = -a \cdot \left[1 + \alpha\left(\frac{\varphi}{\theta}\right)^2 + \beta\left(\frac{\varphi}{\theta}\right)^4 + \gamma\left(\frac{\varphi}{\theta}\right)^6 + \delta\left(\frac{\varphi}{\theta}\right)^8 + \omega\left(\frac{\varphi}{\theta}\right)^{10}\right]\sin(\varphi) +$$

$$a \cdot \left[\frac{2\alpha\varphi}{\theta^2} + \frac{4\beta\varphi^3}{\theta^4} + \frac{6\gamma\varphi^5}{\theta^6} + \frac{8\delta\varphi^7}{\theta^8} + \frac{10\omega\varphi^9}{\theta^{10}}\right]\cos(\varphi)$$

The optimization process is not disclosed in detail since it is carried out according to the steps and with the algorithms and using the constraints as in the steps disclosed above for the gradient-z coil.

As well-known from the gradient coil theory the X-Gradient Coil, i.e. a coil that generate a B_y=G·x field in the ROI, with G=gradient amplitude, is equal for a symmetrical ROI as in the present case to the Z gradient coil and only rotated by 90° around the Y axis.

EXAMPLES

The above method has been carried out considering a spherical ROI V with a diameter of 250 mm. The target gradient field amplitude G has been set to 1 gauss/cm for each of the three gradient coils.

The magnetic field generated by the three optimized gradient coils along Z, Y and X axis and the gradient homogeneity on some cartesian planes has been calculated by using the commercial FEM software Opera.

Figure 6:
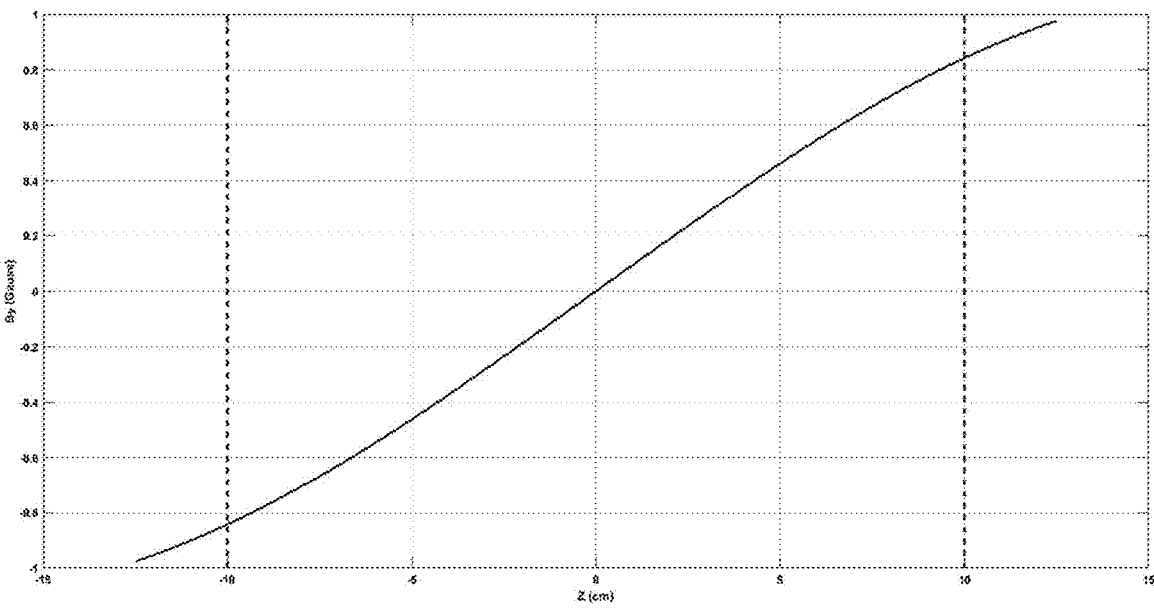
FIG. 6 show a graph representing the linearity of the gradient field along Z axis in a spherical ROI having Diameter of 200 mm.
Figure 7:
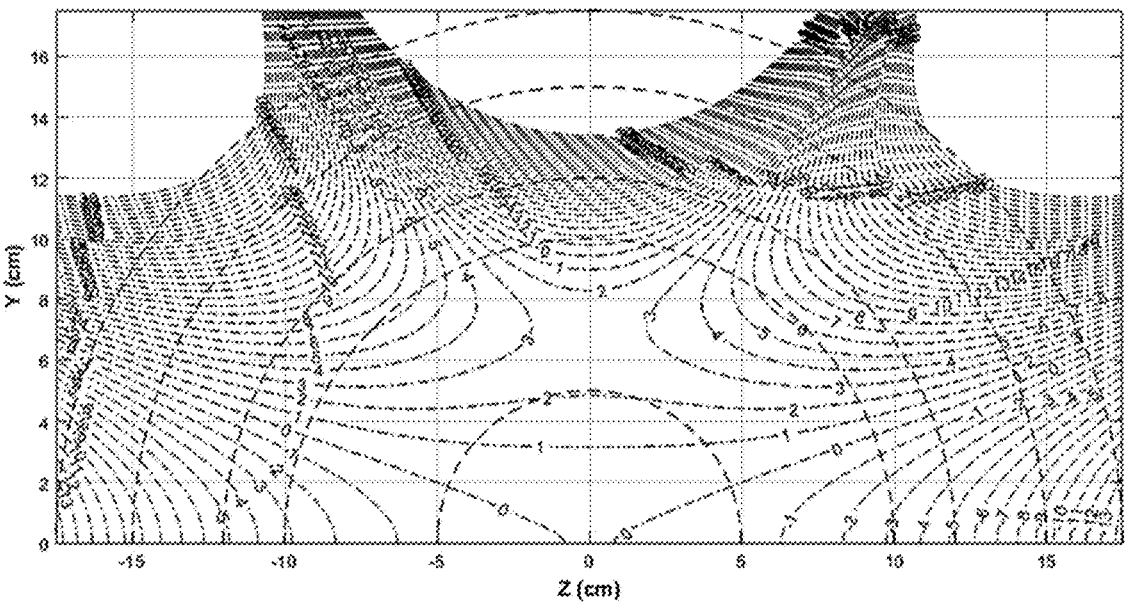
FIG. 7 is a graphical representation of the gradient field in the plane ZY @X=0 of a gradient coil according to FIG. 5 obtained with the method according to the present invention and in a spherical ROI having a diameter of 200 mm. The threshold of 5% being respected.

The z-gradient coils design obtained is shown in FIG. 5. FIGS. 6 and 7 respectively show the linearity of the gradient field along the Z-axis in the defined ROI in a so called DSV (Diameter Spherical Volume) of 200 mm and linearity of the gradient field in the plane Z-Y at X=0 in the same ROI DSV=200 mm. The above mentioned threshold for the maximum non-linearity of 5% being respected. The definition DSV is an acronym used in MRI specific language for specifying that the ROI has a spherical shape with a certain diameter. It has to be understood that a spherical ROI is a non-limiting special case, since the ROI may have any shape.

Figure 9:
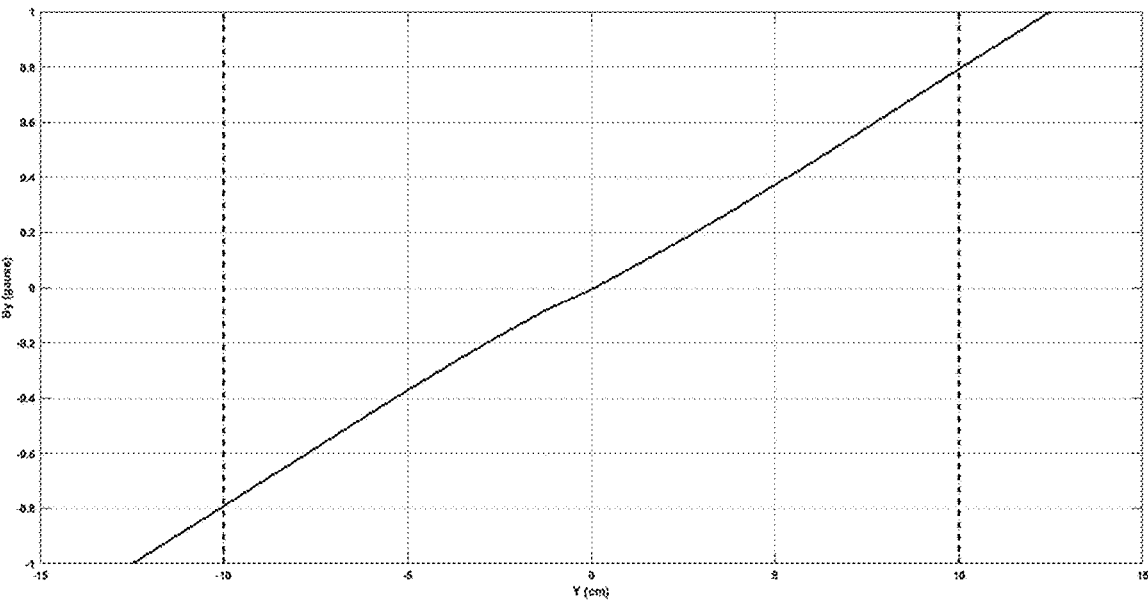
FIG. 9 is a graphic representation of the linearity of the gradient field along the Y axis generated by a gradient coil according to FIG. 8 and in a spherical ROI having a diameter of 200 mm.
Figure 10:
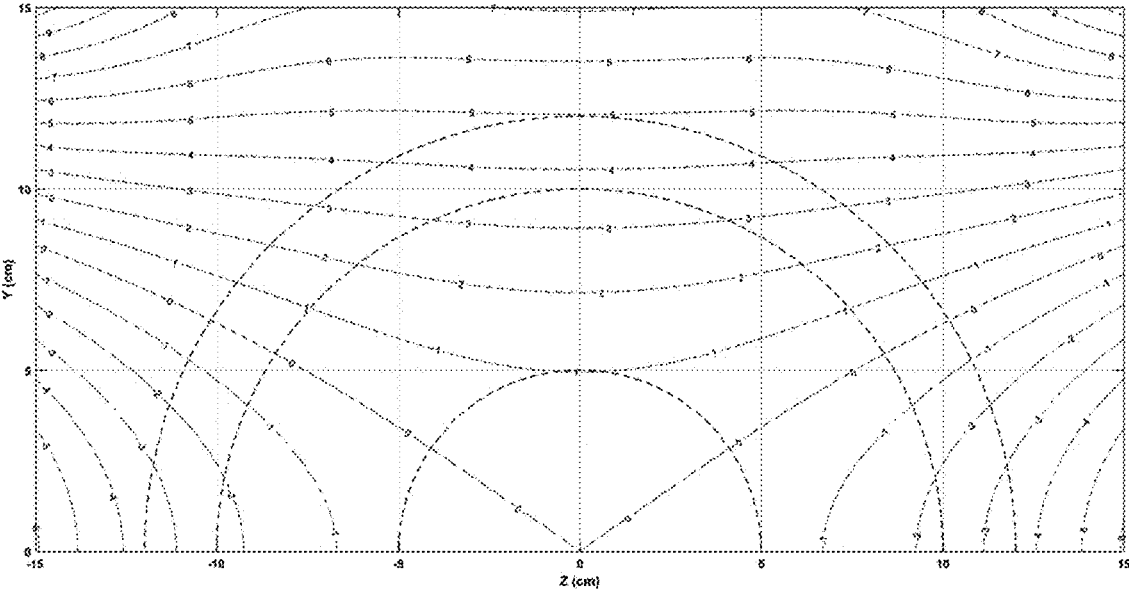
FIG. 10 is a graphic representation of the linearity of the gradient field generated by a gradient coil according to FIG. 8 in the plane ZY @X=0 and in a spherical ROI having a diameter of 200 mm. The threshold of 5% being respected.

FIGS. 9 and 10 show graphical representations respectively of the linearity of the gradient field along Y-axis in the defined ROI and within DSV 200 mm and of the linearity of the gradient field in the plane ZY at X=0 in the said defined ROI and within DSV of 200 mm obtained with the gradient coil according to FIG. 8. Also in this case the threshold of 5% for the maximum non-linearity is respected.

In relation to the optimization steps of the method is worth mentioning that the choice of a minimization of the coil, i.e. the length of the conductive wire, or band or track automatically minimize the power losses of the coil due to Joule effect, thus reducing its impact on the thermal control of the MRI system which is one of the key problems in the MRI technology. The said wire length reduction minimizes also the inductance of the coils and their stored energy enhancing their slew rate, i.e. the speed of switching on/off the coils and which feature represents a key quality factor of a MRI system.

The invention claimed is:

1. A method for producing planar gradient coils for MRI comprises:

defining at least a planar surface along which at least one continuous current wire extends along a path for generating a gradient field along at least one spatial direction of optionally one of three spatial directions defined by a reference cartesian coordinate system;

defining the path of the at least one continuous current wire as a spiral path of a single continuous wire filament;

describing the spiral path of the at least one continuous current wire by a parametric curve according to a modified version of a Pascal Limaçons curve combined with an Archimede's spiral;

applying the Biot-Savart law to evaluate the gradient field generated by the continuous current wire extending along the spiral path; and optimizing parameters of the parametric curve to shape the spiral path of the continuous current wire in such a way as to generate a linear magnetic gradient field along the at least one spatial direction, and which gradient magnetic field is linear inside a predetermined volume of space permeated by the linear magnetic gradient field.

2. The method according to claim 1 in which an optimization algorithm for optimizing the parameters of the parametric curve defining the spiral path along which the continuous current wire extends is a cost function for minimizing two electrical properties of the gradient coil formed by the continuous wire extending along the spiral path which electrical properties consist in the electrical conductance and the electrical resistance of the coil i.e. of the continuous current wire extending along the spiral path.

3. The method according to claim 2, wherein a cost function f of the optimization algorithm is a constrained non-linear programming solver according to the following equation:

$$\min f \text{ such that} = \begin{cases} \max \left| \dfrac{B - B_{target}}{B_{target}} \right| \% < \Delta \\ \min \text{ distance between path} > \delta \\ \max \text{ dimensions of the coils} < \Omega \end{cases}$$

in which $\Delta$ is a value of accepted linearity in the gradient coil design, $\delta$ is the minimal distance between paths of the windings of the spiral coil that ensure no nodes generation (topological constraint) and $\Omega$ is the maximum dimension of the coil in the planar plane where the wire is uncoiled; and in which $B_{target}$ is the gradient field to be generated and approximated.

4. The method according to claim 3 in which the optimization step comprises applying a large-scale interior-point algorithm as a constrained non-linear programming solver.

5. The method according to claim 1, wherein the method provides for the design of two or more magnetic gradient fields, optionally three magnetic gradient fields, each one being a magnetic gradient field along a different spatial direction of two or more spatial directions, optionally of three spatial directions.

6. The method according to claim 1, wherein the three spatial directions are perpendicular one to the other and in a particular embodiment the three spatial directions are defined by the directions of the axis of a three-dimensional cartesian reference system.

7. The method according to claim 1, wherein said method steps are carried out separately for producing planar gradient coils for MRI systems, each one of the planar gradient coils generating a magnetic gradient field in only one of the three spatial directions and each one of the gradient coils comprises at least one continuous current wire extending along a spiral path and which is designed according to the steps of the method according to claim 1.

8. The method according to claim 7, wherein each spiral path of the at least one continuous current wire of each one of the three magnetic gradient coils extends along or is contained in the same planar surface.

9. The method according to claim 1, wherein the following steps are preliminary steps to be carried out before applying the steps according to claim 1:

defining a volume of space, so called ROI (Region of Interest);

said volume of space being defined by an ideal closed surface enclosing the volume of space and defining the peripheral limits of the volume of space;

defining two planar surfaces at diametrically opposite sides of the volume of space along each one of the surfaces the current wire paths of the gradient coils are destined to extends;

the two planes being optionally parallel one to the other;

defining a three dimensional cartesian coordinate system, the two planes being at a distance along a first axis (y) of the three-dimensional coordinate system and extending parallel to the plane defined by a second and a third axis (x, z) of the coordinate system, the parametric curve describing the spiral wire paths for generating a gradient field in the direction of the third axis (z) is calculated according to the following equation:

$$\vec{l} = (l_x, l_z) = \begin{cases} l_x = c \cdot \left(1 - \left(\frac{\varphi}{\theta}\right)^\alpha\right)\cos(\varphi) \\ l_z = e \cdot \left(\frac{\varphi}{\theta}\right)^f + d \cdot \left((1 + \sin(\varphi)) \cdot \left(1 - \left(\frac{\varphi}{\theta}\right)^\beta\right)\right)\sin(\varphi) + k \end{cases}$$

where α, β, c, d, e, θ and k are parameters that shape the curve to be defined in accordance with the optimization procedure (see next paragraph);

the parametric curve describing the spiral wire paths for generating a gradient field in the direction of the first axis (y) is calculated by the following equation:

$$\vec{l} = (l_x, l_z) = \begin{cases} l_x = a \cdot \left[1 + \alpha\left(\frac{\varphi}{\theta}\right)^2 + \beta\left(\frac{\varphi}{\theta}\right)^4 + \gamma\left(\frac{\varphi}{\theta}\right)^6 + \delta\left(\frac{\varphi}{\theta}\right)^8 + \omega\left(\frac{\varphi}{\theta}\right)^{10}\right]\cos(\varphi) \\ l_z = a \cdot \left[1 + \alpha\left(\frac{\varphi}{\theta}\right)^2 + \beta\left(\frac{\varphi}{\theta}\right)^4 + \gamma\left(\frac{\varphi}{\theta}\right)^6 + \delta\left(\frac{\varphi}{\theta}\right)^8 + \omega\left(\frac{\varphi}{\theta}\right)^{10}\right]\sin(\varphi) \end{cases}$$

where a, α, β, γ, δ and ω are parameters that shape the curve;

the gradient field in the direction of the third axis (z-gradient field) being described by the following equation:

$$B_y(x_p, y_p, z_p) = \frac{\mu_0}{4\pi}I\int_0^\theta \frac{dz(x - x_p) - dx(z - z_p)}{R^3}d\varphi \text{ where: } R = $$

$$\sqrt{(x - x_p)^2 + (y - y_p)^2 + (z - z_p)^2} \text{ and } dz = $$

$$\frac{dl_z}{d\varphi} = \left(\frac{e}{\theta}\right)^f \varphi^{f-1} + d \cdot \cos(\varphi) \cdot \left[1 - \left(\frac{\varphi}{\theta}\right)^\beta \cdot \sin(\varphi) + d \cdot (1 + \sin(\varphi))\right] \cdot$$

$$\left(-\left(\frac{\beta}{\theta}\right)^\beta \cdot \varphi^{\beta-1}\right) \cdot \sin(\varphi) + d \cdot (1 + \sin(\varphi)) \cdot \left(1 - \left(\frac{\varphi}{\theta}\right)^\beta\right) \cdot \cos(\varphi)$$

and the gradient field in the first direction (y-gradient field) being described by the following equation:

$$B_y(x_p, y_p, z_p) = \frac{\mu_0}{4\pi}I\int_0^\theta \frac{dz(x - x_p) - dx(z - z_p)}{R^3}d\varphi \text{ where } R = $$

$$\sqrt{(x - x_p)^2 + (y - y_p)^2 + (z - z_p)^2} \, dz = $$

$$\frac{dl_z}{d\varphi} = a \cdot \left[1 + \alpha\left(\frac{\varphi}{\theta}\right)^2 + \beta\left(\frac{\varphi}{\theta}\right)^4 + \gamma\left(\frac{\varphi}{\theta}\right)^6 + \delta\left(\frac{\varphi}{\theta}\right)^8 + \omega\left(\frac{\varphi}{\theta}\right)^{10}\right]\cos(\varphi) + $$

$$a \cdot \left[\frac{2\alpha\varphi}{\theta^2} + \frac{4\beta\varphi^3}{\theta^4} + \frac{6\gamma\varphi^5}{\theta^6} + \frac{8\delta\varphi^7}{\theta^8} + \frac{10\omega\varphi^9}{\theta^{10}}\right]\sin(\varphi) \text{ and } dx = $$

$$\frac{dl_x}{d\varphi} = -a \cdot \left[1 + \alpha\left(\frac{\varphi}{\theta}\right)^2 + \beta\left(\frac{\varphi}{\theta}\right)^4 + \gamma\left(\frac{\varphi}{\theta}\right)^6 + \delta\left(\frac{\varphi}{\theta}\right)^8 + \omega\left(\frac{\varphi}{\theta}\right)^{10}\right]\sin(\varphi) + $$

$$a \cdot \left[\frac{2\alpha\varphi}{\theta^2} + \frac{4\beta\varphi^3}{\theta^4} + \frac{6\gamma\varphi^5}{\theta^6} + \frac{8\delta\varphi^7}{\theta^8} + \frac{10\omega\varphi^9}{\theta^{10}}\right]\cos(\varphi)$$

according to a further feature, the cost function is the following:

$$\text{cost function } f = L_{COIL} = \oint_i^0 d\vec{l} = \int_0^\theta \sqrt{dz^2 + dx^2}\, d\varphi.$$

10. The method according to claim 9, in which a design of the gradient coil generating a gradient field in the second axis direction (x) is equal to a design of the gradient coil generating the gradient field in the third axis direction (z) but rotated by 90° around the y-axis.

11. A planar gradient coil comprising at least one conductive wire, band or track extending along at least one planar surface, in which the at least one conductive wire, band or track extends along a spiral path;

said spiral path being designed according to claim 1.

12. The gradient coil according to claim 11, wherein the gradient coil comprises at least two conductive wires, bands or tracks extending along a respective spiral path and each of the spiral paths extends along a respective one of two planar surfaces being parallel to each other and at a certain distance one from the other along a first axis (y), while the two plane surfaces extend along a second and a third axis perpendicular to the first axis.

13. The gradient coil according to claim 12, wherein said gradient coil is configured for generating a gradient field in the direction of the second or third axis and comprises for each of the two planar surfaces, two non-coinciding spiral paths, and along each one of the two planar surfaces a conductive wire, band or track extends along the two spiral paths being symmetrical to one another in relation to an axis oriented perpendicular respectively to the second axis for the coils generating the gradient field in the direction of the second axis and to the third axis for the coils generating the gradient field in the direction of the third axis or to a plane extending perpendicular to the second or third directions.

14. The gradient coil according to claim 11, for generating the gradient magnetic field in the direction of the first axis wherein it comprises on at least one or both planar surfaces a wire extending along a spiral path having a circular shape and which windings are centred with the first axis.

15. An MRI system comprising a magnet structure comprising:

a static magnetic field generator in a spatial volume, the static magnetic field being oriented parallel to a first axis, said static magnetic field generator forming a gantry, delimiting said spatial volume;

gradient coils for generating gradient magnetic fields inside said spatial volume, respectively a magnetic gradient field in the direction of the first axis, a magnetic gradient field in the direction of a second axis perpendicular to the first axis, and a magnetic gradient field in a direction parallel to a third axis perpendicular to the first axis and to the second axis;

RF-coils for generating RF excitation signals of nuclear spins due to a physical capacity of atomic nuclei of absorbing and re-emitting electromagnetic radiation;

at least one RF-antenna for collecting the RF excitation signals emitted by transition of the nuclear magnetic spins from an excited condition in which the nuclei has absorbed electromagnetic energy into the relaxed condition in which the nuclei has re-emitted the absorbed electromagnetic energy;

a magnet driving and control section which is configured to drive resistive or a superconductive magnet when the static magnetic field generator comprises resistive or a superconductive magnets, or which is responsible for executing temperature controls of the magnetized material when the static magnetic field generator comprises permanent magnets;

a gradient coils driving unit which is configured to drive the gradient coils in a synchronized way with the generation and transmission of the RF-excitation signals;

a RF generation unit configured to generate the RF excitation signals to be transmitted by the RF excitation coils to a target region of a body under examination and which region is coincident or contained inside a spatial volume permeated by the static magnetic field and the gradient magnetic fields;

a processing unit configured to process RF signals acquired by the RF antenna and to transform said RF signals into image data;

a display control unit configured to process the image data in order to display these data according to different display modes on a display monitor, and in which:

each of the gradient coils comprises at least a continuous conductive wire, band or track which extends along a spiral path, said spiral path extending on at least one of a plane which is perpendicular to the direction of the static magnetic field or along two planes which are parallel to each other and perpendicular to the direction of the static magnetic field and which are placed at diametrically opposite sides of the volume of space permeated by the static magnetic field; and each of the spiral paths of the continuous current wires being shaped according to claim 1.

* * * * *